(12) United States Patent
Divakaruni et al.

(10) Patent No.: US 6,426,526 B1
(45) Date of Patent: Jul. 30, 2002

(54) SINGLE SIDED BURIED STRAP

(75) Inventors: Ramachandra Divakaruni, Somers; Jack A. Mandelman, Sotrmville; Gary B. Bronner, Stormville; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/870,068

(22) Filed: May 30, 2001

Related U.S. Application Data

(63) Continuation of application No. 09/603,442, filed on Jun. 23, 2000.

(51) Int. Cl.$^7$ ............................................. H01L 27/108
(52) U.S. Cl. ...................................... 257/302; 257/301
(58) Field of Search .................................. 257/301, 302; 438/152, 386

(56) References Cited

U.S. PATENT DOCUMENTS

| | | | |
|---|---|---|---|
| 4,830,978 A | | 5/1989 | Teng et al. .................... 437/52 |
| 5,389,559 A | * | 2/1995 | Hsieh et al. ................... 437/52 |
| 5,519,236 A | | 5/1996 | Ozaki ........................... 257/302 |
| 5,627,092 A | * | 5/1997 | Alsmeier et al. ............ 438/152 |
| 5,909,044 A | * | 6/1999 | Chakravarti et al. ........ 257/301 |
| 6,110,792 A | * | 8/2000 | Bronner et al. ............. 438/386 |

* cited by examiner

*Primary Examiner*—Hoai V. Ho
*Assistant Examiner*—Tu-Tu Ho
(74) *Attorney, Agent, or Firm*—Steven Capella

(57) ABSTRACT

An easily manufactured connecting structure from a node conductor of trench capacitor device is characterized at least in part by the presence of an isolation collar located above the node conductor, at least a portion of the collar having an exterior surface which is substantially conformal with at least a portion of an adjacent wall of the trench, a buried strap region in the trench above the node conductor, the strap region being bounded laterally by the isolation collar except at an opening in the collar. The connecting structure is preferably formed by a method involving clearing an isolation collar from a first interior surface of a deep trench at a location above a storage capacitor while leaving the isolation collar at other surfaces of the deep trench.

6 Claims, 18 Drawing Sheets

SINGLE SIDED BURIED STRAP

This application is a continuation of U.S. patent application Ser. No. 09/603,442, filed on Jun. 23, 2000, now pending.

FIELD OF THE INVENTION

The present invention relates to certain aspects of semiconductor devices and processing for forming them. In particular, the present invention relates to a single sided buried strap and a method for forming a single sided buried strap.

SUMMARY OF THE INVENTION

The present invention provides a method for clearing an isolation collar from a first interior surface of a deep trench at a location above a storage capacitor while leaving the isolation collar at other surfaces of the deep trench. A barrier material is deposited above a node conductor of the storage capacitor. A layer of silicon is deposited over the barrier material. Dopant ions are implanted at an angle into the layer of deposited silicon within the deep trench, thereby leaving the deposited silicon unimplanted along one side of the deep trench. The unimplanted silicon is etched. The isolation collar is removed in locations previously covered by the unimplanted silicon, leaving the isolation collar in locations covered by the implanted silicon.

The present invention also includes a method for clearing an isolation collar from a first interior surface of a deep trench at a location above a storage capacitor while leaving the isolation collar at other surfaces of the deep trench. A deep trench fill is recessed to a level of a bottom of a strap. A photoresist mask is deposited over portions of a liner in the deep trench. The photoresist mask is utilized to etch down unmasked portions of the liner to a top of polysilicon filling the deep trench. The photoresist mask is stripped. The isolation collar is etched, leaving the isolation collar in locations covered by the liner.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

Figure 1:
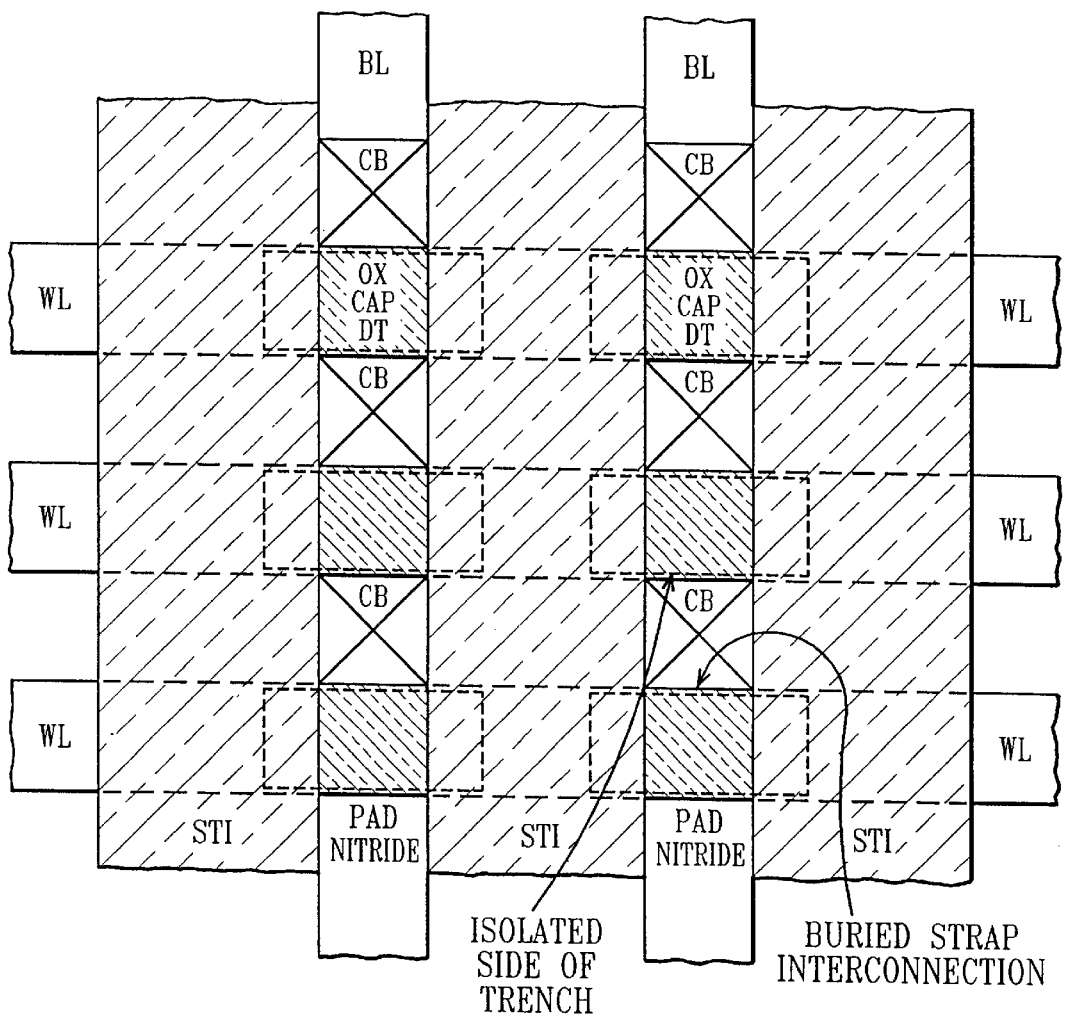
FIG. 1 represents an overhead view of a crosspoint DRAM memory array.

In a crosspoint DRAM memory array, bitlines and wordlines crisscross the array and a storage capacitor is accessible at every place where a bitline crosses a wordline. In FIG. 1 illustrates an example of such an array in which, the wordlines cross the semiconductor surface along one axis and the bitlines cross the surface along a perpendicular axis and a storage capacitor is formed in the bottom of each deep trench (DT) represented by the dark areas in FIG. 1. The access transistor is formed vertically along one sidewall of the deep trench above the storage capacitor, such that the gate conductor lies along that sidewall. The elements of the vertical MOSFET transistor include a drain region within the single crystal silicon at the edge of the trench, this is coincident with the "buried strap outdiffusion", a gate conductor along one sidewall of the trench, and a source of the transistor in the surface plane under the contact to bitline (CB) areas.

In such crosspoint designs, each storage capacitor typically must be accessible from only one side of the deep trench, otherwise the one wordline, one bitline, one memory bit rule would be violated. Therefore, an interconnection is formed between the storage capacitor and the vertical sidewall only along one sidewall of the deep trench, while the deep trench is isolated along all other sidewalls. In the structure illustrated in FIG. 1, two of the deep trench sidewalls are isolated by shallow trench isolation (STI) regions. Of the two deep trench sidewalls that coincide with the active areas, a buried strap is formed along one of them, and the other sidewall is isolated.

Since the active area of the memory is defined by stripes along the semiconductor surface, (in FIG. 1 the stripes are coincident with the bitline (BL) pattern), there needs to be methods to form the buried strap interconnection and vertical transistor along the one deep trench sidewall, while isolating the other sidewall coincident with the active area pattern.

The present invention provides a number of solutions for forming a self-aligned single sided buried strap in a vertical trench DRAM.

In a $6F^2$VTC DRAM with rectangular layout in a $2F^2$ trench opening area the vertical transistor is typically formed on one side of the trench. A conventional MINT-like layout is not favorable because of buried strap scaling limitations and lithography limitations. The other side can thus not be cut off by the IT formation at $6F^2$ like in MINT layouts. The application of an additional mask is difficult for overlay reasons so it is thus preferable to form the buried strap in a self-aligned manner.

Methods according to the present invention can eliminate spurious strap formations, which, in turn, drives deep shallow trench isolation for sub $8F^2$ cells. Also, the structure according to the present invention can eliminate the need for a deep shallow trench isolation (STI) in all directions. The method and structure according to the present invention also provide "lithographic friendly" cells. Along these lines, the present invention provides "lithographically friendly" active area definitions for trench cells. The present invention also permits buried bit lines stacked vertical DRAM cells to have shallow trench isolation.

Some sub $8F^2$ DRAMS cells that include trench or buried bit line stacked DRAMs require the use of single sided junctions for a vertical transfer device. The present invention provides a method for leaving the collar in place in a conventional trench process on one or many sides of the trench that holds the vertical transfer device.

Also among the advantages of the present invention are methods of providing a process flow for forming a single sided buried strap without the use of a mask and forming a single sided strap prior to etching of the collar. Furthermore, the present invention can enable high density DRAM self-fabrication by selectively removing one side of a collar using angled implantation. The present invention can include utilizing implant species such as P, As, N, O, and Ar, if desired, and utilizing oxidation to enhance selectivity.

FIGS. 2–7 illustrate a structure according to the present invention at various stages of an embodiment of a process according to the present invention for forming a self-aligned single sided buried strap that utilizes a standard vertical transistor (VTC) process as a basis. The symmetry in the structure is broken with an angle implant process. High aspect ratios for the angled implants are not necessary because the structure is transferred by an anisotropic etch.

Figure 2:
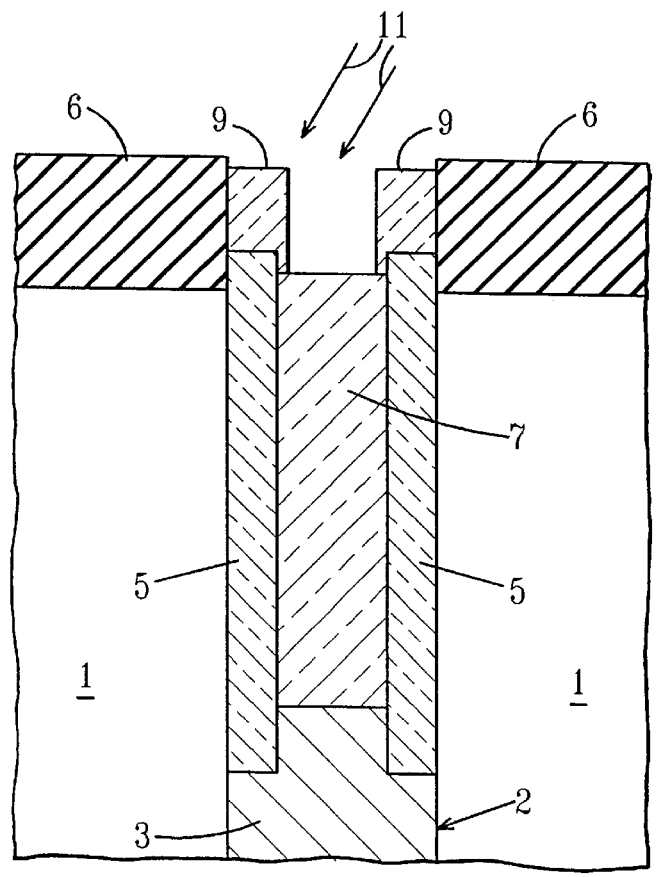
FIGS. 2–7 represent cross-sectional views of an embodiment of a structure according to the present invention at various stages according to an embodiment of a process according to the present invention.

FIG. 2 illustrates a structure according to the present invention at a beginning stage of an embodiment of the process according to the present invention, where the process of the present invention may begin to deviate from standard processing. In the structure illustrated in FIG. 2, a deep trench has been formed in a substrate. Collar regions 5 have been formed in deep trench 2 formed in the semiconductor substrate 1. Silicon nitride regions 6 have been formed on the upper surface of the substrate 1. After a deep recess of the trench polysilicon 3, oxide region 7 has been deposited in the space between the collar regions 5 in the top part of the trench. The upper surface of the oxide region 7 has been recessed.

Polysilicon has been deposited in the top of the deep trench over the collar and oxide regions. The polysilicon may optionally be etched to form spacer regions 9. At this point, an implant may then be carried out at an angle as indicated by arrows 11.

After carrying out the angled implant, a wet etch may be selectively carried out to remove the unimplanted polysilicon. The oxide region 7 is then etched by a reactive ion etch (RIE). The reactive ion etch of the oxide is selective to the nitride 6 and the polysilicon 9. the overetch of this RIE step forms a little crevice or "divot" on the trench sidewall. The resulting structure is illustrated in FIG. 3.

At this stage, a nitridization may be carried out to form buried strap (BS) nitride 8. Buried strap polysilicon 10 may then be deposited in recess. Trench top oxide may then be deposited in recess. The polysilicon spacer 9 may then be etched.

Figure 4:
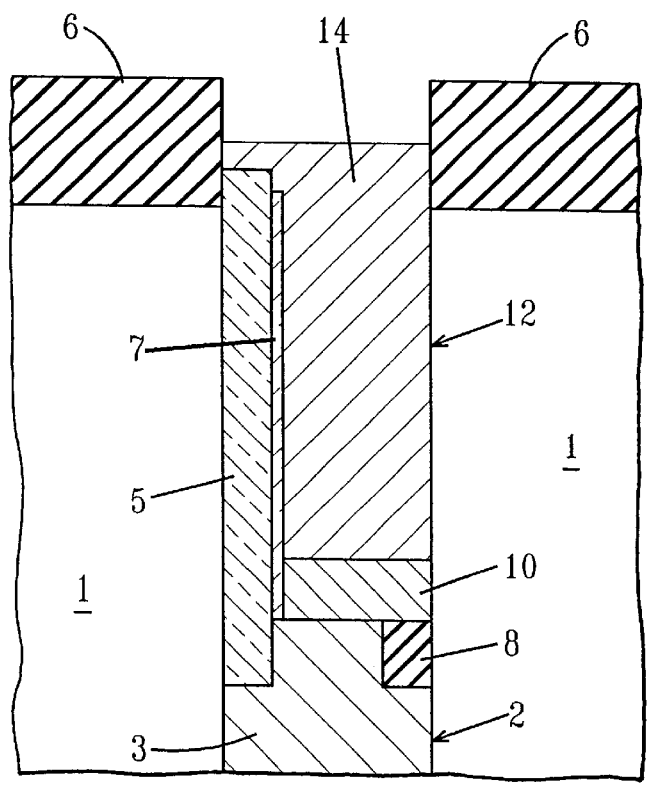

A sacrificial oxide region may then be created and gate oxide 12 grown. Gate polysilicon 14 may then be deposited in the trench. FIG. 4 illustrates the structure at this point in the process.

Figure 3:
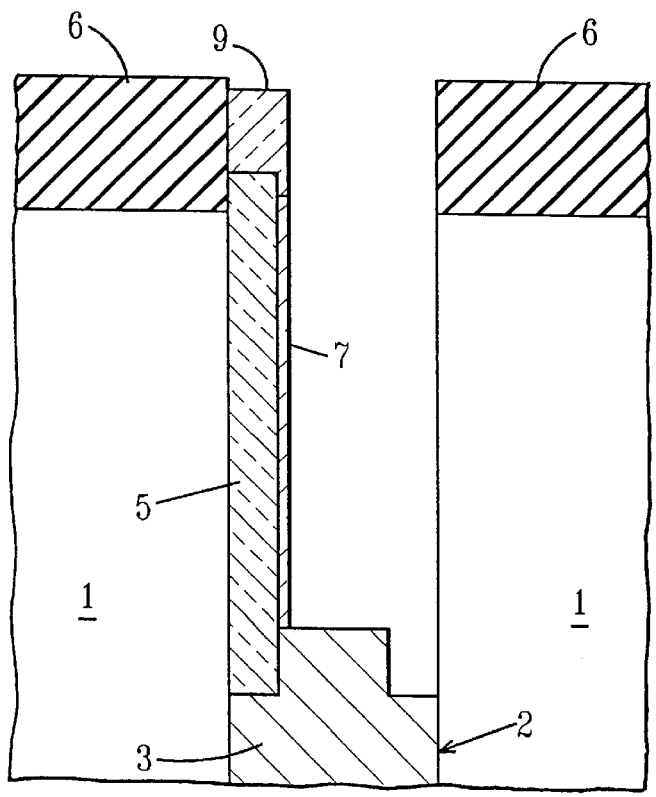
Figure 5:
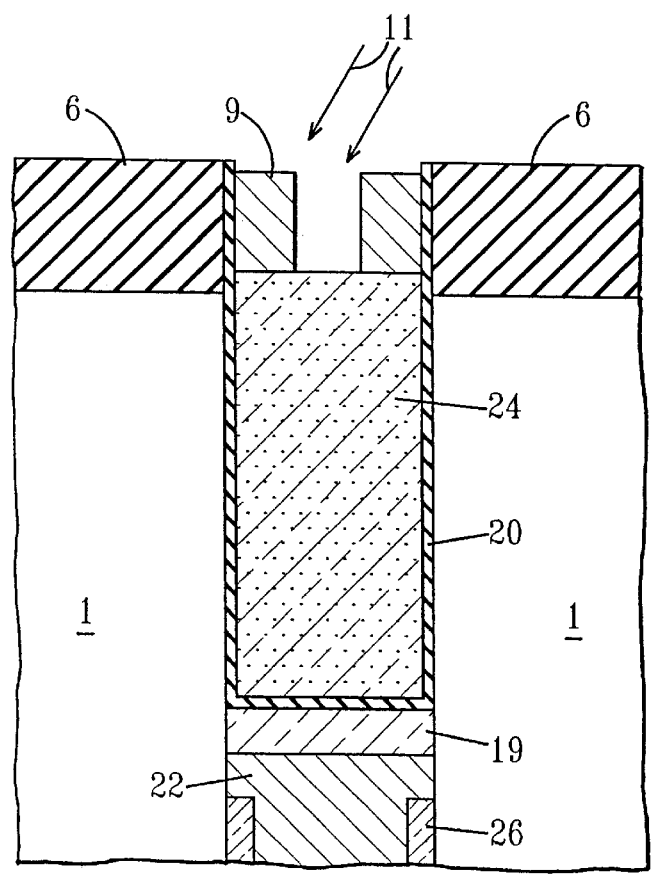
Figure 6:
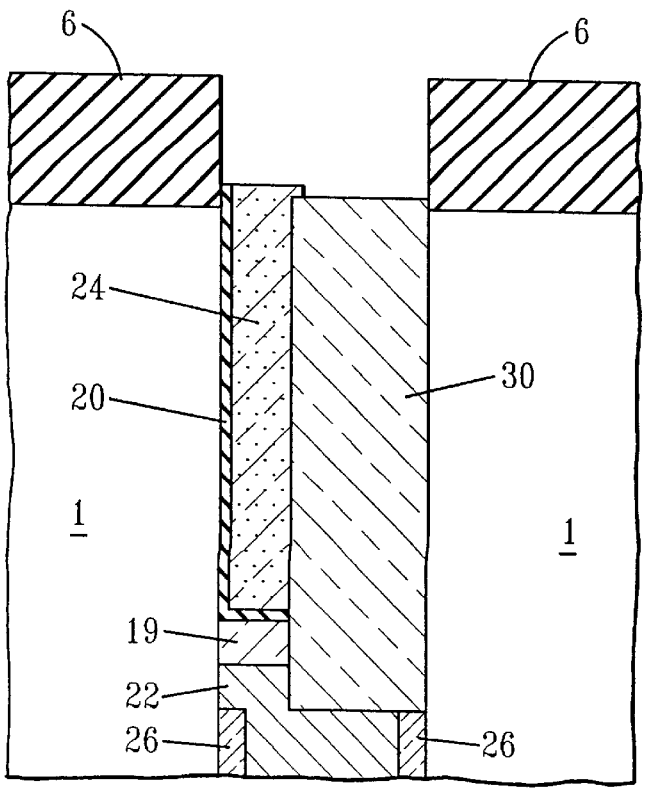
Figure 7:
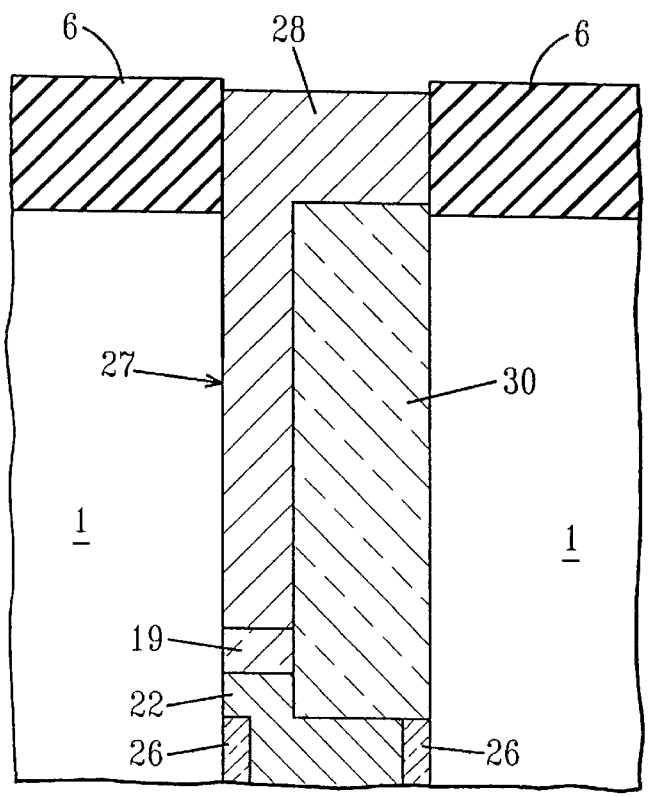

FIGS. 5–7 illustrate a second variation of the process illustrated in FIGS. 2–4. FIG. 5 illustrates the structure in which a deep trench has been formed in a semiconductor substrate. The strap polysilicon 22 is deposited followed by the trench top oxide. Nitride regions have been deposited on the surface of the substrate. Trench top oxide region may be formed in the deep trench. Doped or undoped glass 24 has been deposited in the trench and recessed. Polysilicon has been deposited in the trench and spacer regions etched. An angled implant may then been performed. FIG. 5 illustrates the resulting structure. Along these lines, FIG. 5 also illustrates collar regions 26, trench top oxide 19, nitride liner 20 and polysilicon spacer 9.

At this point, a wet etch may be carried out to selectively remove the unimplanted polysilicon and nitride. Oxide in the structure may then be etched selective to the polysilicon and nitride, typically with a reactive ion etch. The RIE stops on the nitride liner 20. The liner may again etched with a nitride RIE selective to oxide and polysilicon. The RIE may again be continued to etch oxide selective to nitride and polysilicon. This etches through the trench top oxide 19.

Next, the polysilicon may be etched, also typically utilizing the reactive ion etch. This etches the spacer 9 as well as the strap polysilicon. Oxide 30 may be used to fill the space. The oxide fill may then be etched back to the level illustrated in FIG. 6.

Another wet etch may then be carried out on the doped glass. The underlying nitride liner 20 may be removed. Next, a sacrificial oxide region, gate oxide region 26 is grown on the structure. Polysilicon 28 for the gate structure may then be deposited. The polysilicon may then be etched to result in the structure illustrated in FIG. 7.

FIGS. 8–11 illustrate cross-sectional views of a structure at various stages according to another embodiment of a process according to the present invention.

Figure 8:
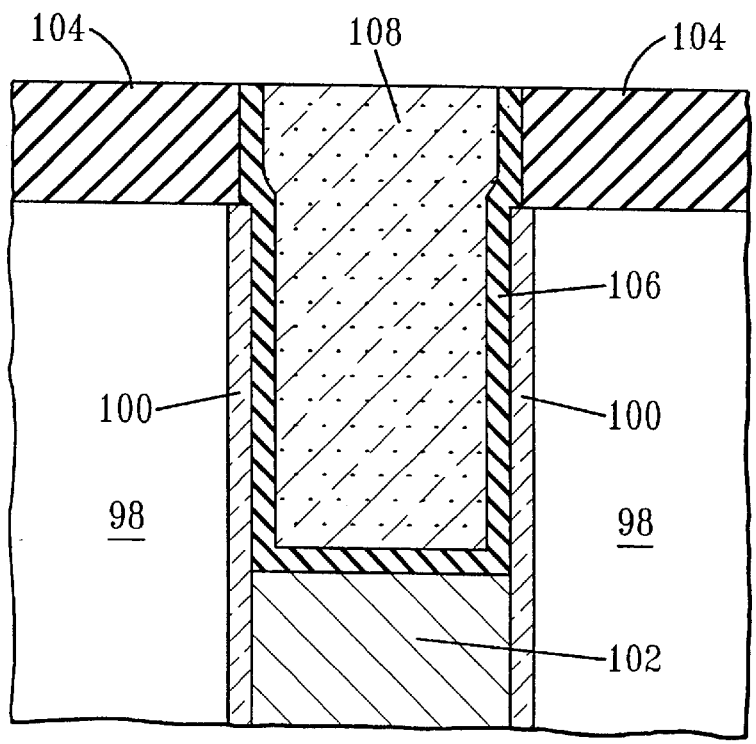
FIGS. 8–13 represent cross-sectional views of an embodiment of a structure according to the present invention at various stages according to another embodiment of a process according to the present invention.

Along these lines, FIG. 8 illustrates a structure after a standard trench formation process. A deep trench has been formed in substrate. Collar regions 100 have been formed on surfaces of the deep trench. The trench has been filled with polysilicon fill 102. Nitride regions 104 have been formed on the upper surface of substrate 98 adjacent the deep trench opening.

The trench polysilicon 102 may be recessed to a depth desirable to form a buried strap. A dielectric liner 106 may be formed on the surfaces of the deep trench/collar. The dielectric liner may be made of any suitable material. For example, such a material is silicon nitride (SiN) or oxide deposited from a tetraethylorthosilicate (TEOS) precursor. If the liner includes TEOS it needs to be densified if the material subsequently deposited in the trench includes doped glass. However, deposition of the liner is optional. This can be seen in FIG. 8, TEOS/doped glass region 108 may be deposited in the deep trench over the liner 106.

If the liner is not deposited, TEOS may be deposited and the upper surface of the structure polished down to the layer of pad nitride regions 104. Another example of a material that may be utilized in the liner is silicon nitride. The material filling the trench, whether or not the liner is utilized, may be oxide. The oxide may be doped glass.

Figure 9:
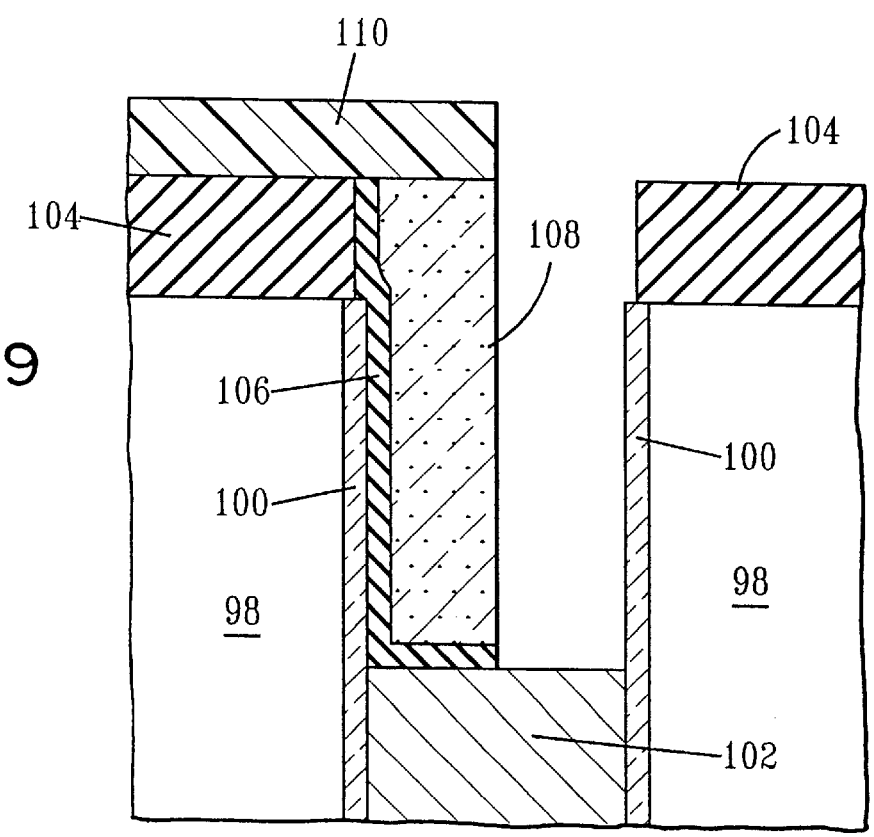

The next step in this embodiment of the process is to define a resist mask 110 on the surface of the structure. The resist mask may be utilized to etch the oxide on one side the trench to result in the structure illustrated in FIG. 9. To result in the structure illustrated in FIG. 9, the etch is selective to silicon nitride. If the structure includes a silicon nitride, the liner can also be etched in this step. If the node nitride or dielectric liner, present in the inside of the collar is removed before the doped glass is deposited, the exposed collar may also be etched in this step. The resist mask may then be removed. FIG. 9 illustrates the resulting in structure.

The exposed portion of the collar may now then be etched. Any suitable etch may be utilized. One example of an etch that may be utilized is a wet HF chemistry. Another example is an isotropic plasma etch. If the trench had been filled with doped glass to form the region 108 illustrated in FIG. 8, the wet etch would remove the doped glass as well to result in the structure illustrated FIG. 11. Otherwise, the structure would be as illustrated in FIG. 10.

Figure 12:
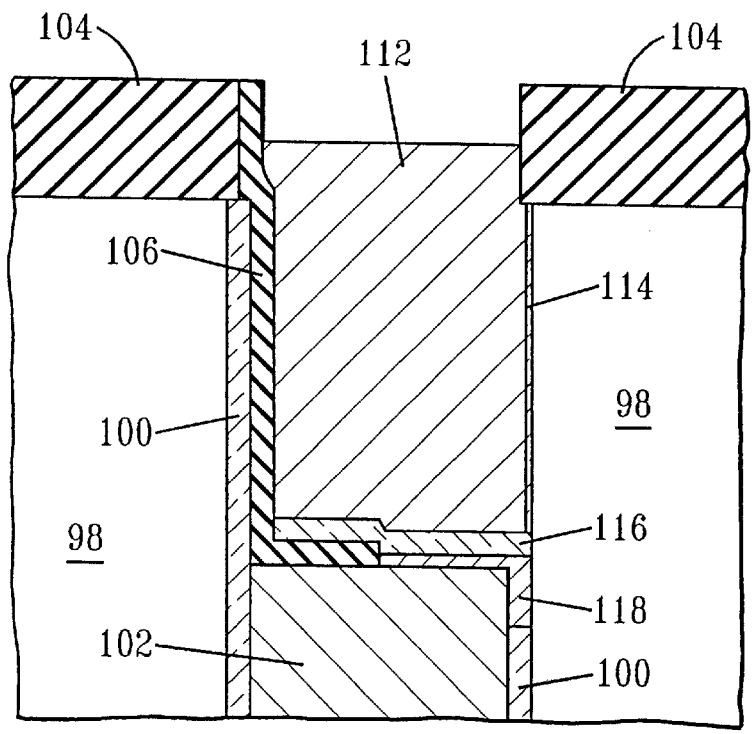

The buried strap may now then be formed by a buried poly etch back process and then the trench top dielectric is deposited. The standard process may then be utilized to form the vertical device and for post trench processing. The resulting structure is illustrated in FIG. 12. Along these lines, FIG. 12 illustrates pad nitride regions 104, collar region 100, liner region 106, and gate polysilicon 112 has been deposited in the deep trench transfer gate oxide 114 has been formed on the wall of the deep trench where the collar was removed. Trench top dielectric 116 has been deposited as described above in the buried strap polysilicon 118 deposited as well.

The vertical transistor may then be formed on the side of the deep trench where the collar has been removed.

Figure 10:
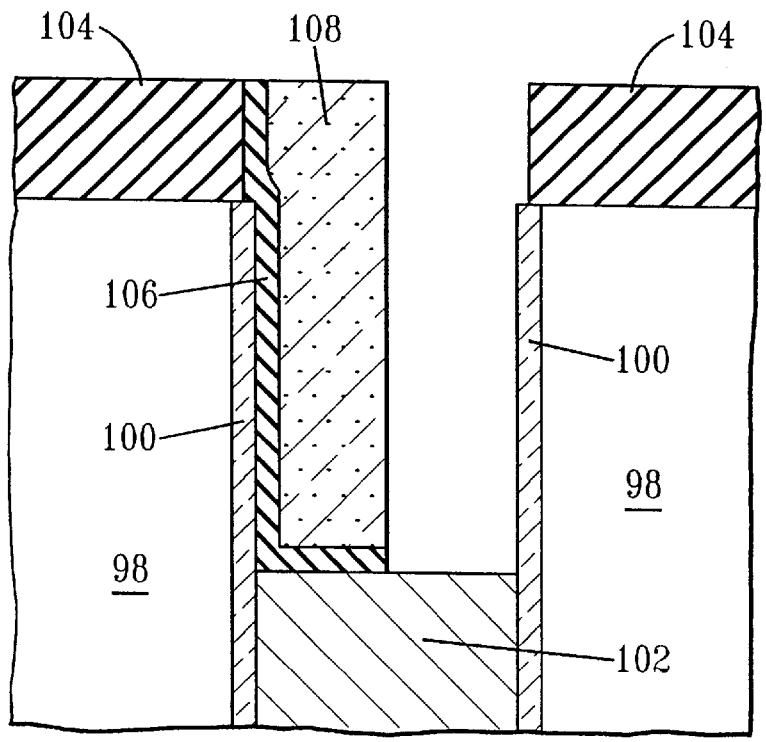
Figure 11:
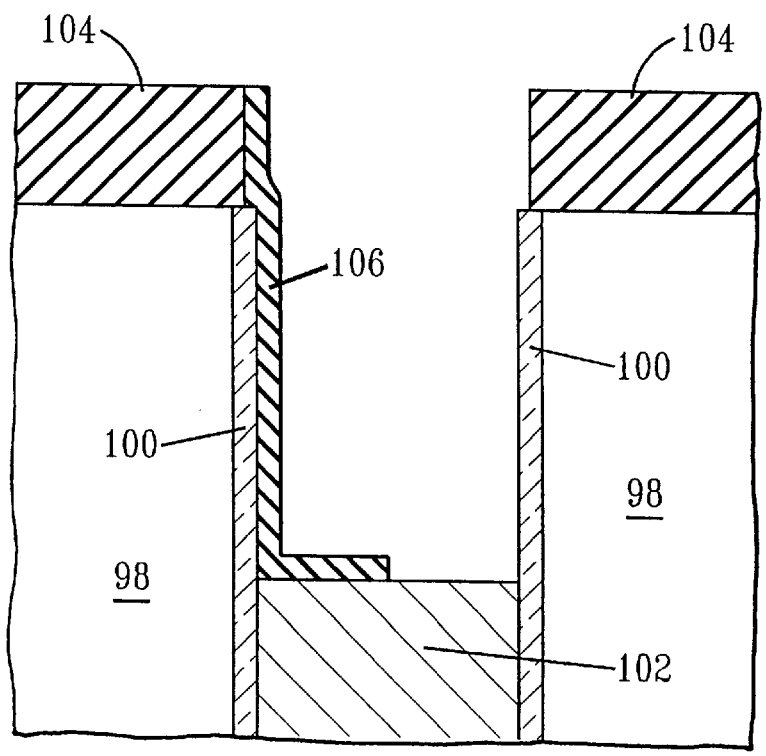
Figure 13:
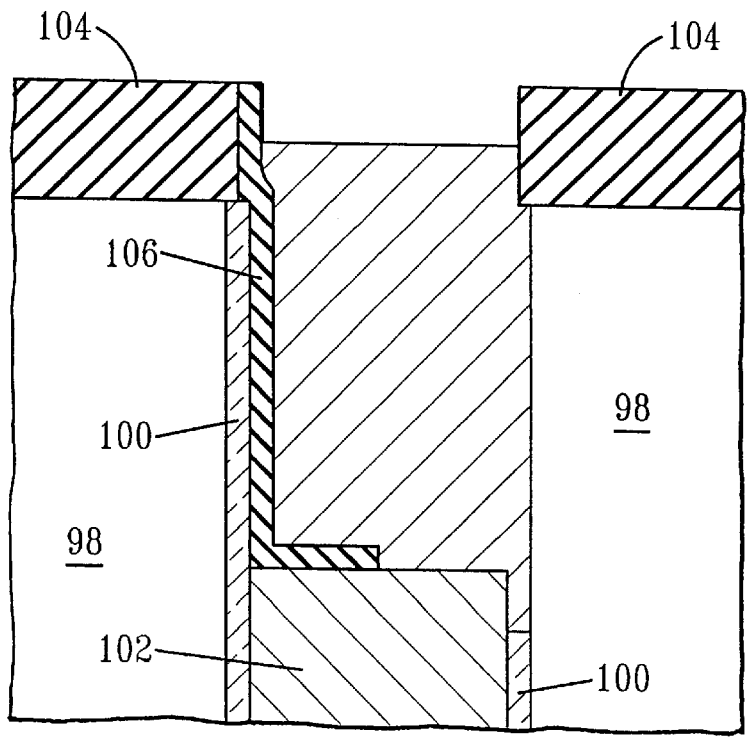

In another embodiment of the process represented in FIGS. 8–12, the substrate is processed to result in the structure illustrated in FIGS. 10 or 11. Then, rather than forming a buried strap, a thin dielectric may then deposited followed by deposition of polysilicon to result in the structure illustrated in FIG. 13. Further processing is carried out including isolation trench formation and a polysilicon mandrel may be removed in buried strap formed followed by trench top dielectric and formation of the vertical device.

Advantages of second variation of this particular embodiment of a process according to the present invention include lowering the buried strap out diffusion. Also, this second embodiment has the ability to combine vertical and planar oxidation. Furthermore, this embodiment allows for a wiring conductor that contacts the trench without risk of isolation of the trench gate polysilicon from the subsequent gate wiring polysilicon.

Figure 14:
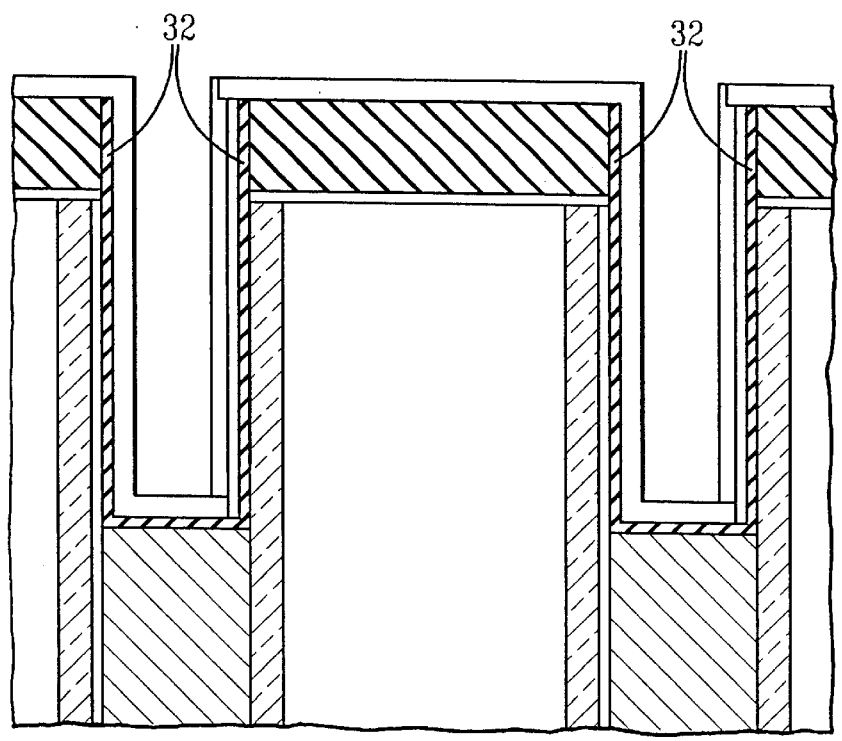
FIGS. 14–25 represent cross-sectional views of an embodiment of a structure according to the present invention at various stages according to a further embodiment of a process according to the present invention.

FIGS. 14–25 illustrate cross-sectional views of another embodiment of a structure according to the present invention. As illustrated in FIG. 14, deep trenches have already been formed in a substrate. The trench is filled with polysilicon and recessed.

After forming this recess, a thin blocking layer 32 may be formed Any suitable material may be utilized in the blocking layer. One example of a blocking layer is a nitride. For example, silicon nitride (SiN) may be utilized. The blocking layer typically has a thickness of about 50 Å.

After deposition of a blocking layer, a layer of amorphous silicon may be deposited over the entire structure. The amorphous silicon layer may be formed in any thickness. According to one example, the amorphous silicon layers is about 100 Å thick.

Figure 15:
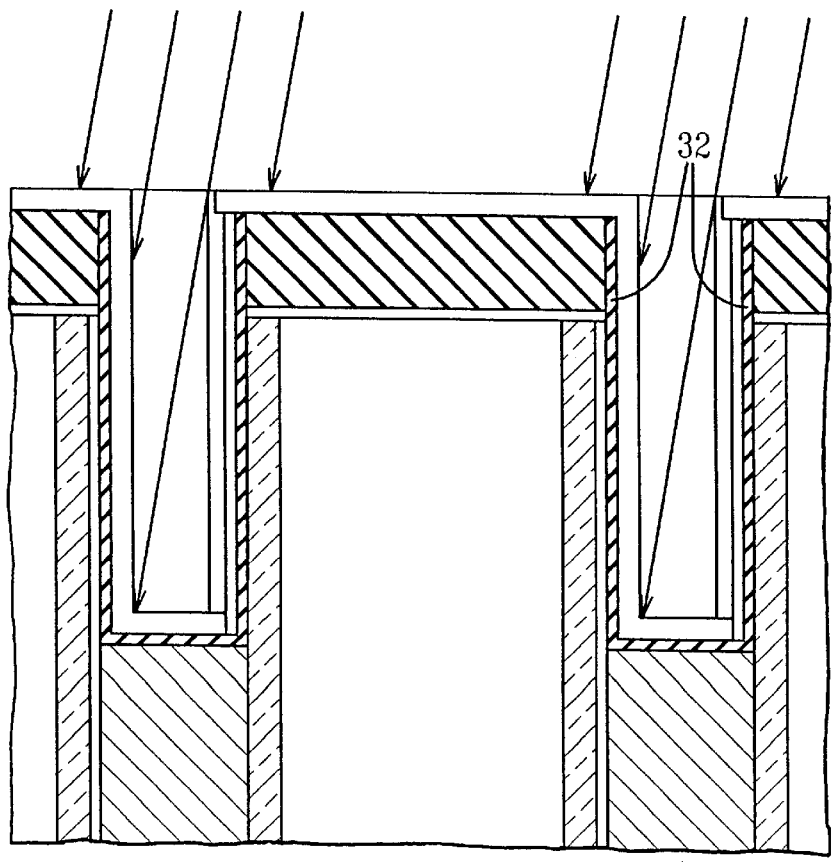

After depositing the amorphous silicon layer, an angled implant may be carried out as indicating in FIG. 15. The implanted species may be boron. The implant may be angled from about 7 degrees to about 15 degrees with respect to a line normal to the plane of the substrate.

After carried out the angled implant, undoped amorphous silicon may be etched selective to the boron doped silicon. Etching the undoped amorphous silicon exposes portions of the blocking layer as well as the collar. The exposed portions of the blocking layer and the collar may then be etched to result in the structure illustrated in FIG. 16. the collar is typically etched with reactive ion etch.

Figure 16A:
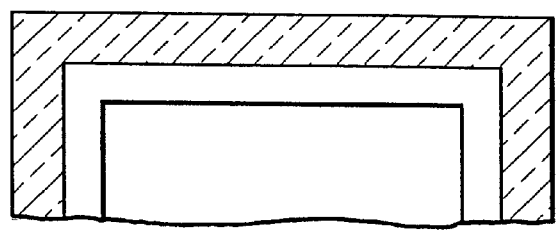
Figure 16:
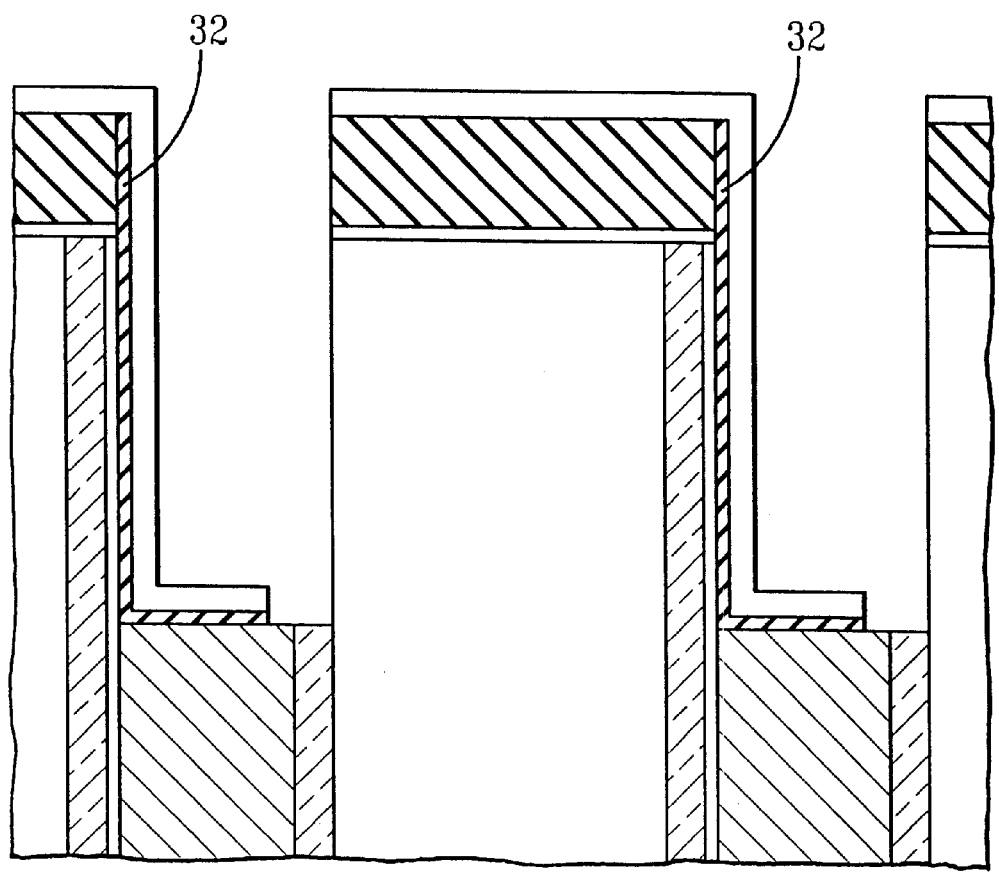

FIG. 16A illustrates the deep trench from above, showing that the collar and doped amorphous silicon are arranged on only a portion of the deep trench.

Next, a thin silicon nitride layer may be deposited. The silicon nitride layer may be in the order of about 20 Å to about 50 Å thick. A silicon nitride RIE may then be carried out to prevent lateral under etch of the collar. This nitride is shown as layer 124 in FIG. 17.

The polysilicon not protected by the nitride 124 may then be etched.

Next, a portion of the collar may be etched to create a collar divot that extends below the upper surface of the recessed polysilicon in the deep trench. The collar divot etch may be a wet etch.

Figure 17A:
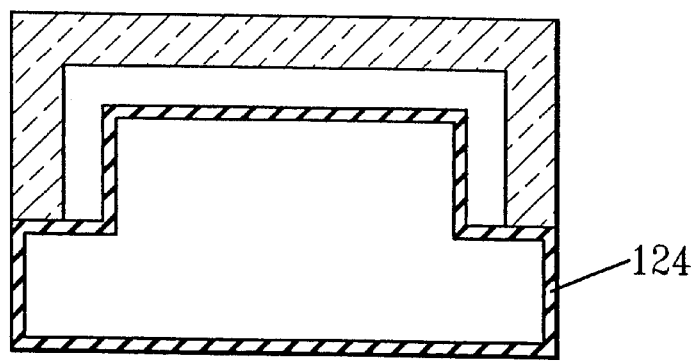
Figure 17:
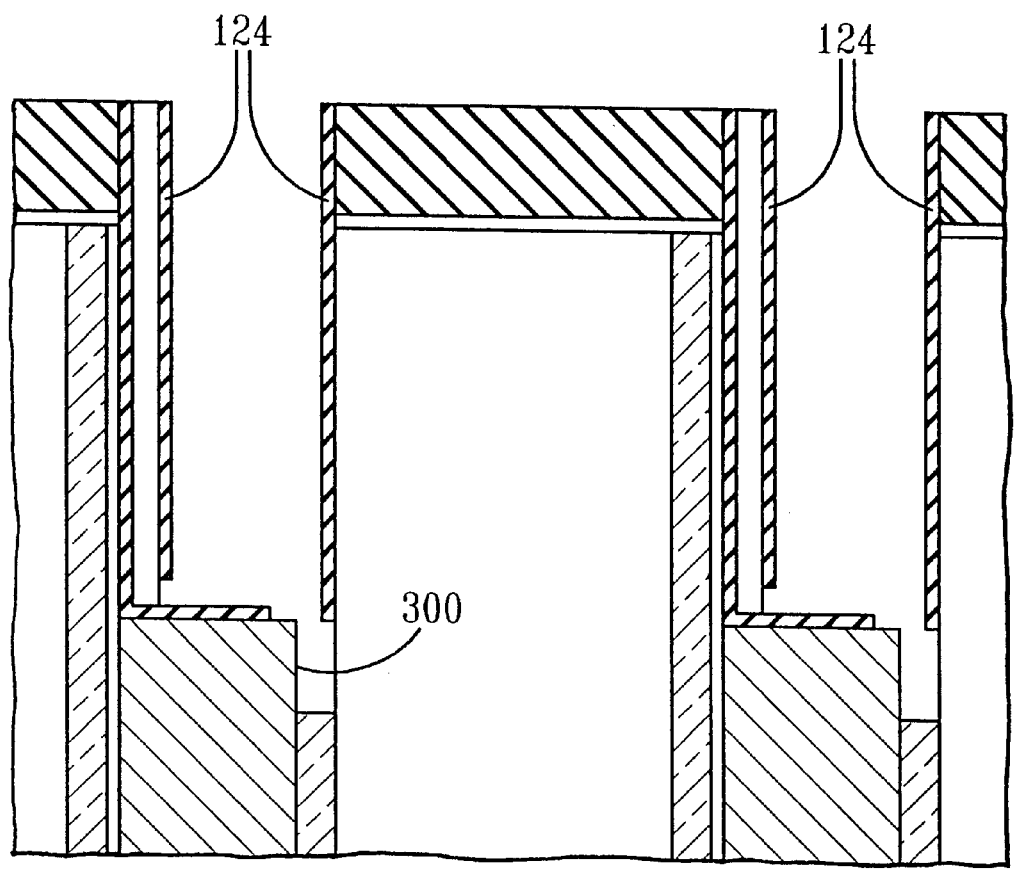

FIG. 17 illustrates the resulting structure. FIG. 17A illustrates the deep trench from above, illustrating the silicon nitride layer deposited.

At this stage in the process, a silicon nitride etch may be carried out to remove silicon nitride 124 and the node nitride 300. Then, polysilicon may be deposited to result in this structure illustrated in FIG. 18. The polysilicon forms the buried strap and is thus referred to as the buried strap (BS) poly.

Figure 18A:
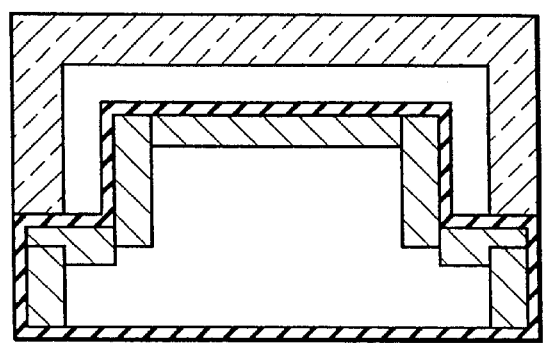
Figure 18:
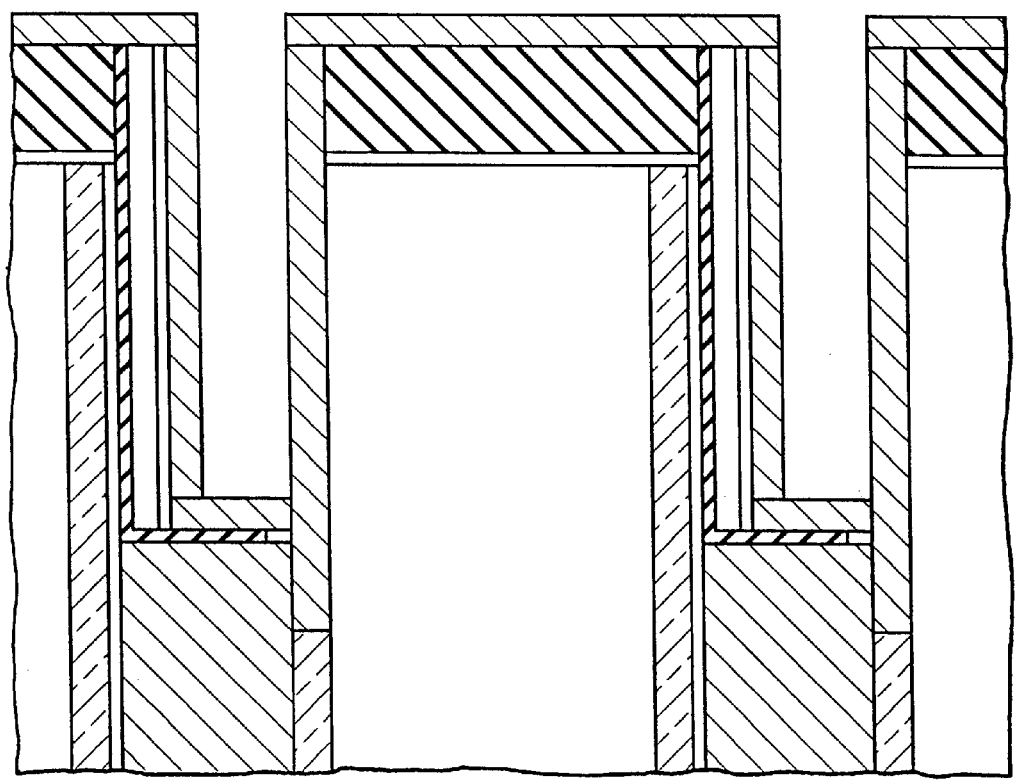

FIG. 18A illustrates the deep trench from above, illustrating the deposited polysilicon layer.

Figure 19A:
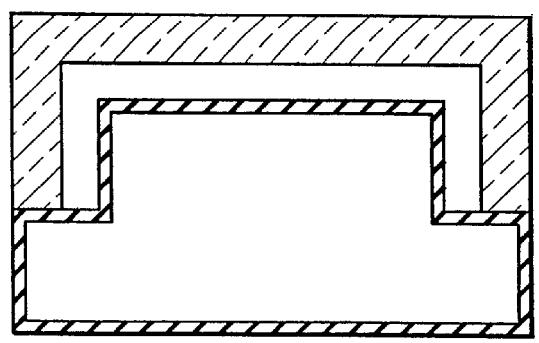
Figure 19:
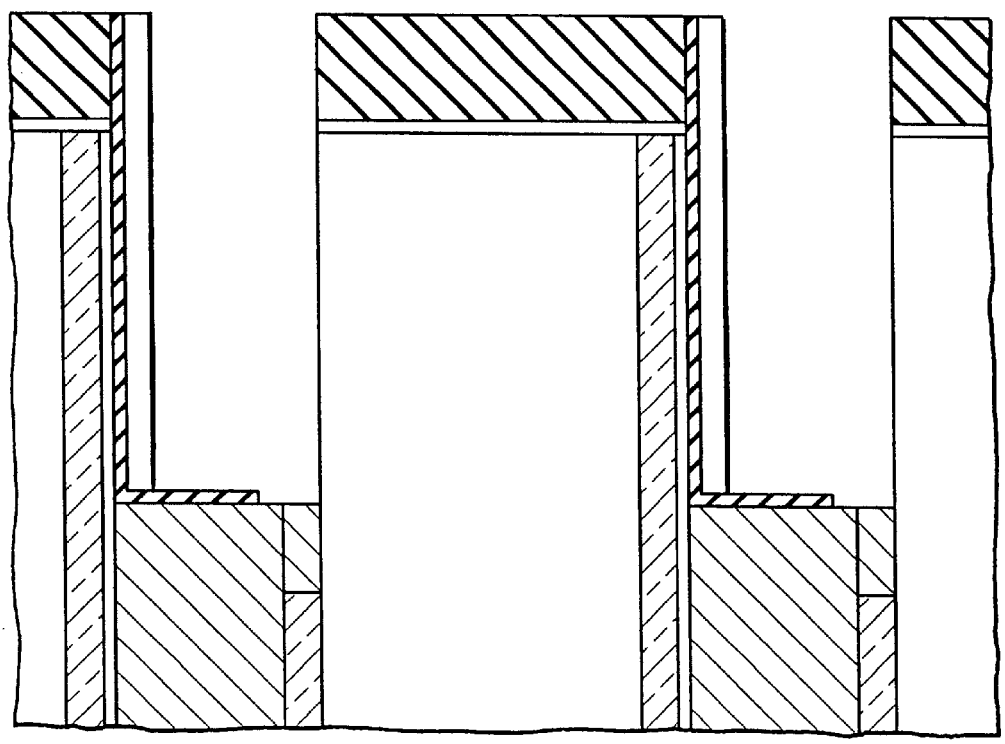

The buried strap polysilicon may then be etched to result in the structure illustrated in FIG. 19. As can be seen in FIG. 19, the polysilicon remains in the collared divot created previously. FIG. 19A illustrates the deep trench formed by the process up to this point.

Figure 20:
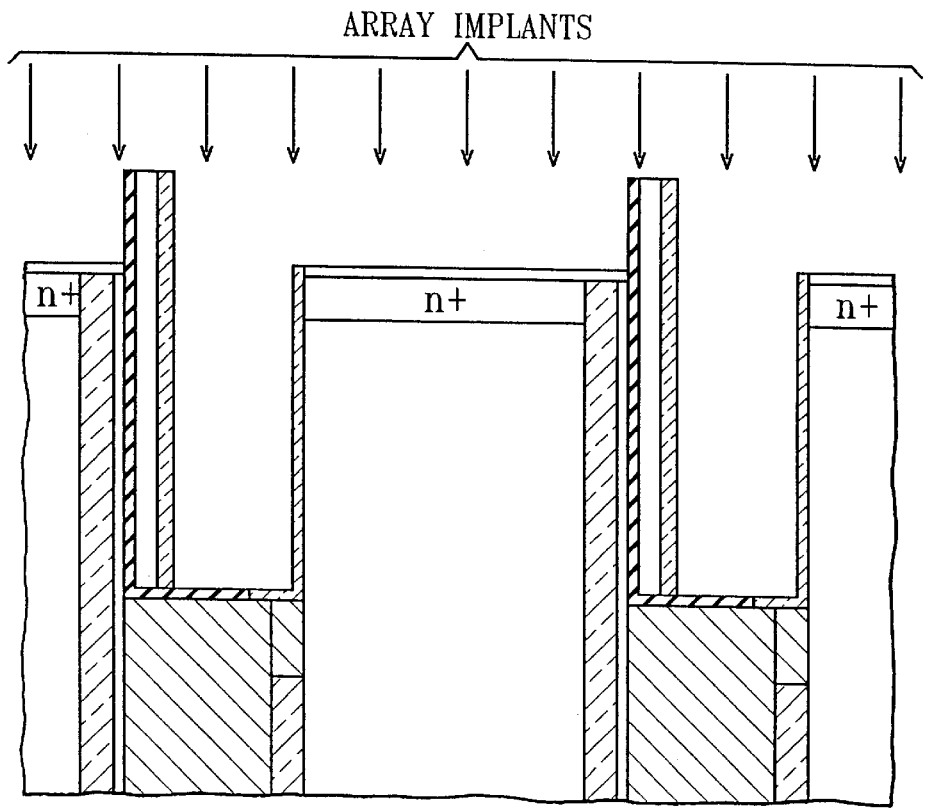

A sacrificial oxide layer may then be provided on the deep trench wall. The sacrificial oxide may be created by oxidizing the material at the sidewall. Alternatively, the oxide may be deposited. The pad nitride regions may be then be stripped and array implants (n+) carried out as indicated by arrow in FIG. 20. FIG. 20 illustrates the resulting structure.

Figure 21:
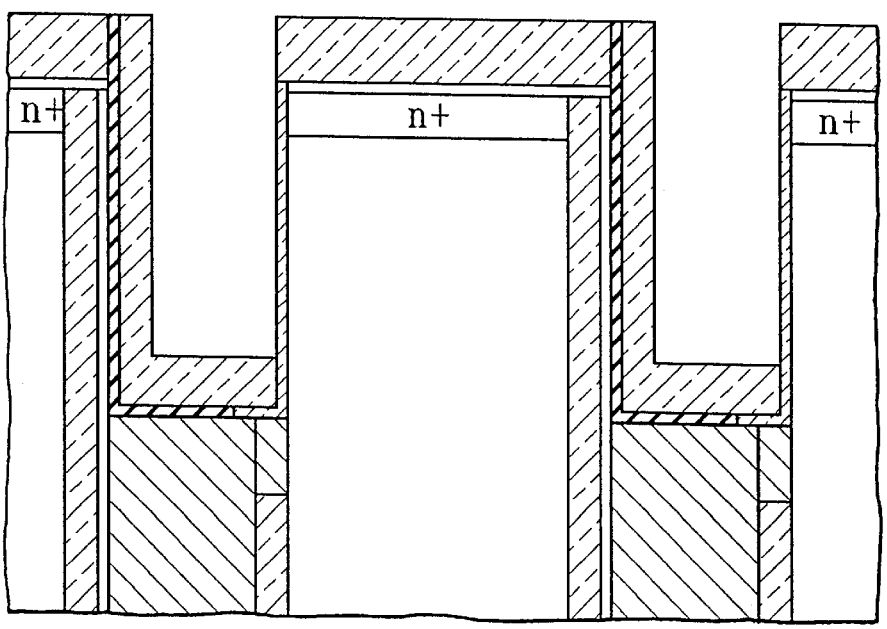

Trench top oxide may then be deposited on the entire structure. The trench top oxide may be etched from one sidewall of the deep trench. Gate oxidation may then be carried out the resulting structure as illustrated in FIG. 21.

Figure 22A:
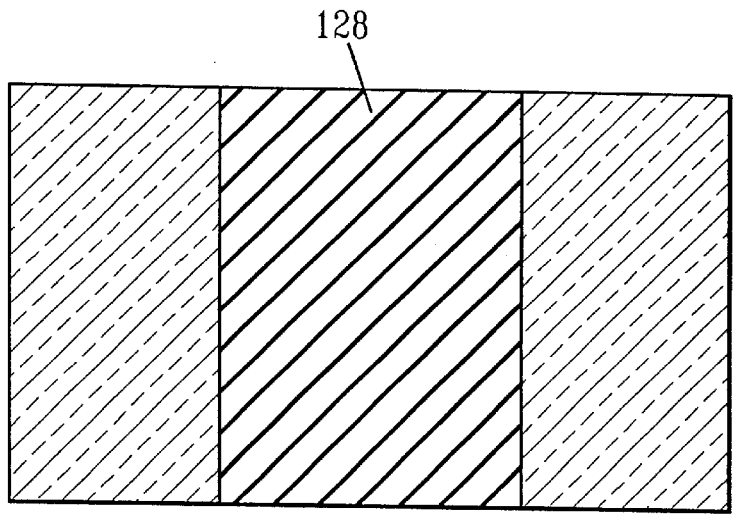
Figure 22:
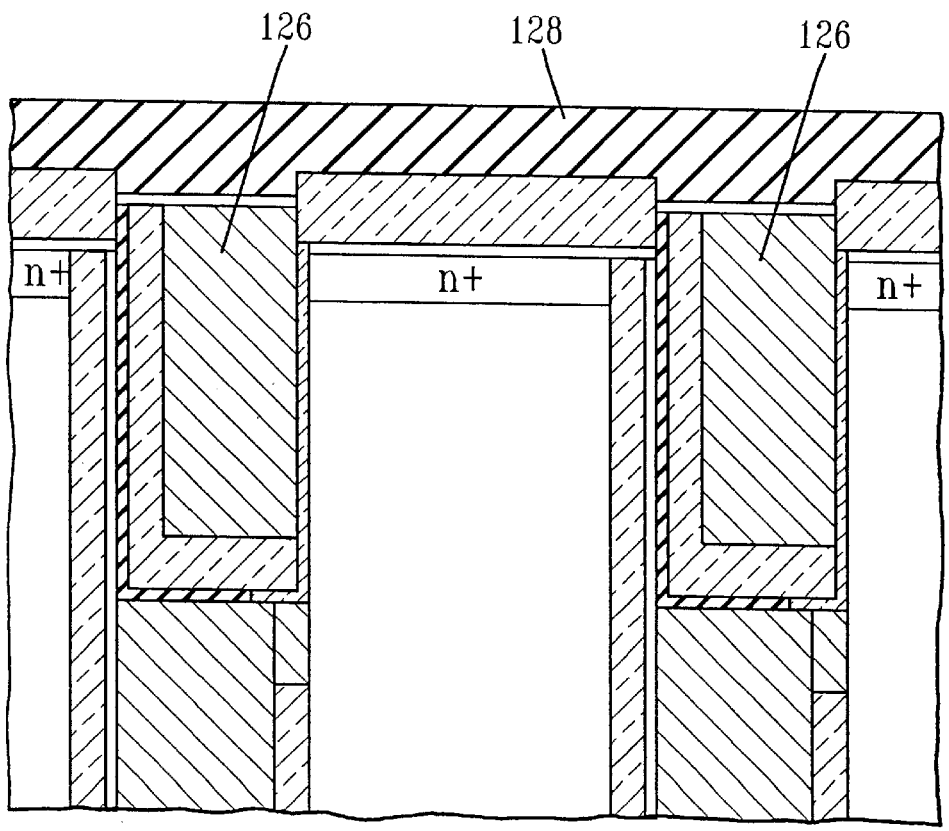

At this point in the process, gate polysilicon 126 may be deposited. The gate polysilicon may be planarized to the level of the trench top oxide. Silicon nitride may then be deposited 128. Then, lithography, etch, fill, and planarization steps are carried out to define the active area. FIG. 22 illustrates the resulting structure. FIG. 22A illustrates a portion of the structure illustrated in FIG. 22 from above.

Figure 23:
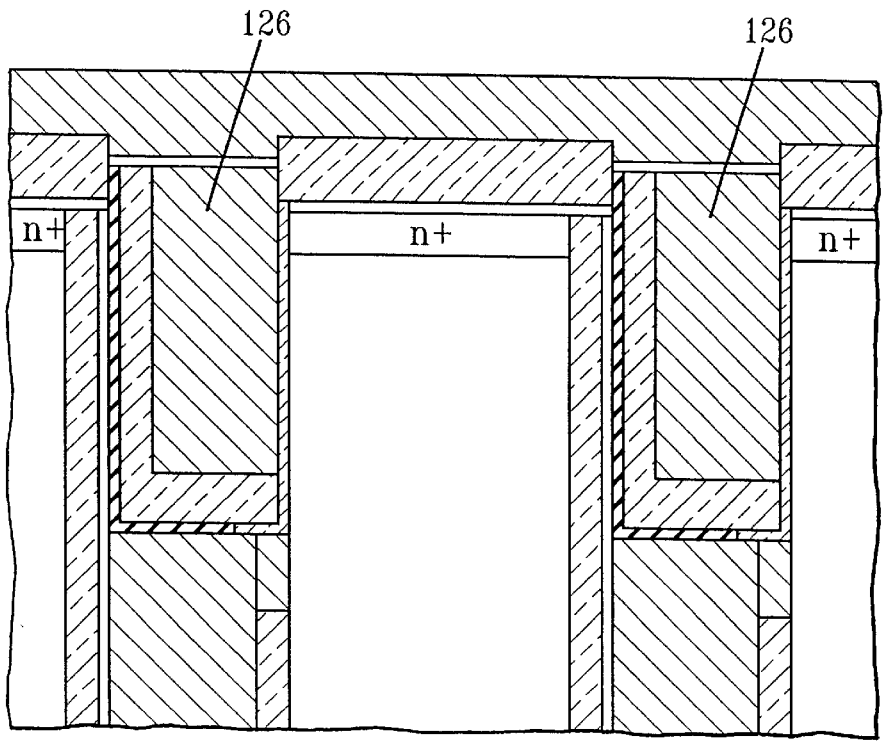

The pad nitride may then be stripped. A non-critical mask may be defined for carried out a trench top oxide etched in the supporting structures. A support structure sacrificial oxide may be created and implants carried out. The support gate oxide and polysilicon may be deposited. FIG. 23 illustrates the resulting structure in the array.

Figure 24:
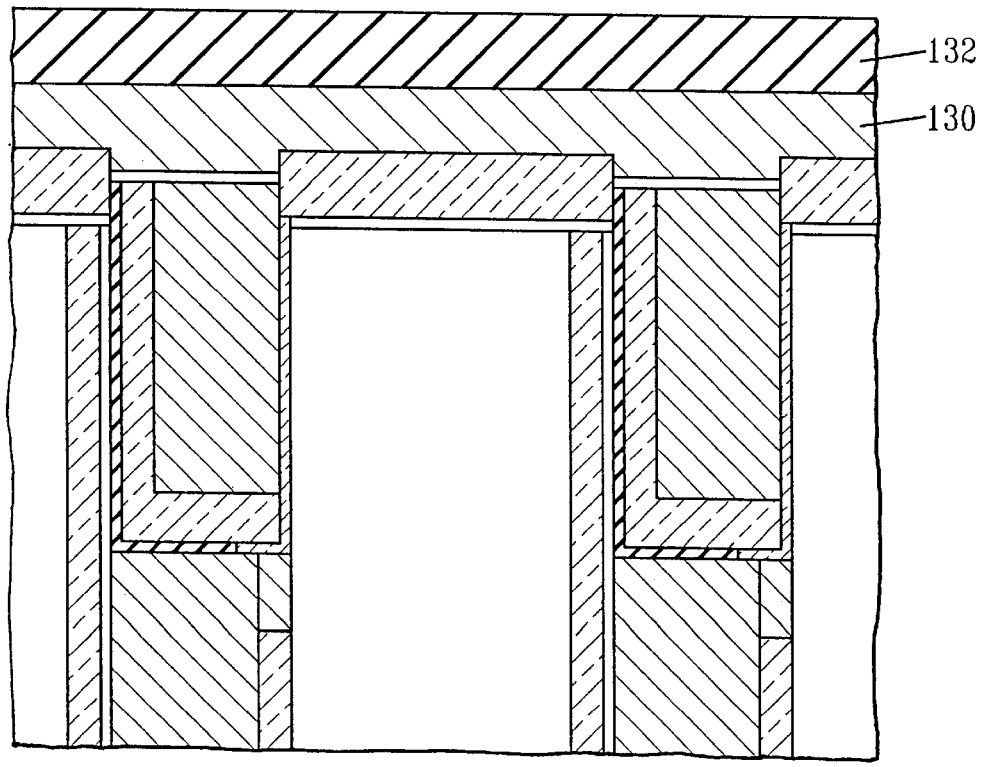

A non-critical mask may be created to for polysilicon etch in the array (not shown). Support gate oxide etch in the array may be carried out (not shown). A tungsten (W) or tungsten silicide (WSix) stack 130 may be deposited. The gate conductor (GC) pad nitride 132 may then be deposited. FIG. 24 illustrates the resulting structure.

Figure 25:
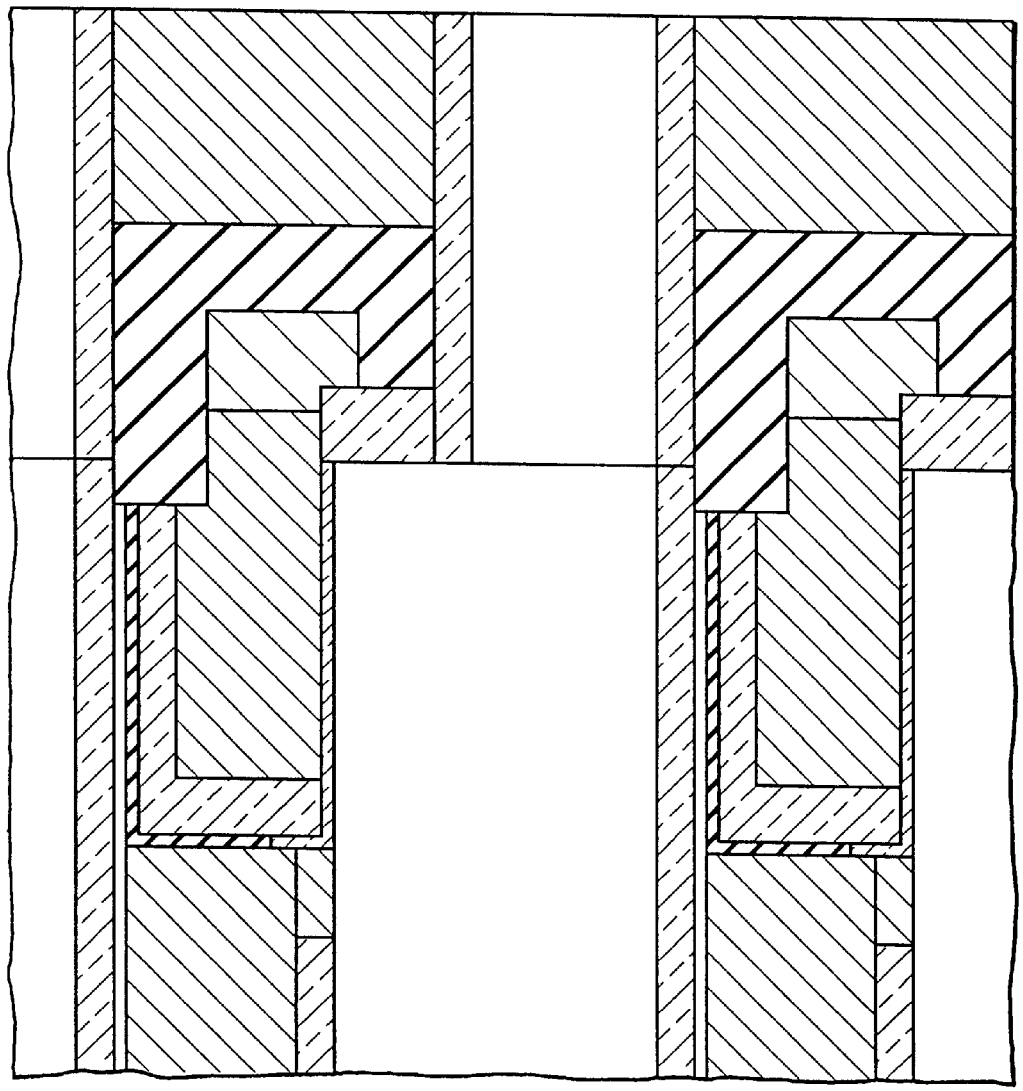

Finally, GC stack etch may be carried out. The structure may then be processed according to standard processing. The resulting is shown in FIG. 25.

High aspect ratio deep trenches can make it difficult to perform the angled implant described above. According to a further embodiment of the present invention, the aspect ratio of the deep trench may be reduced by prefilling the deep trench with a layer of TEOS. The process steps shown in FIGS. 26–28 may then be carried out.

Figure 26:
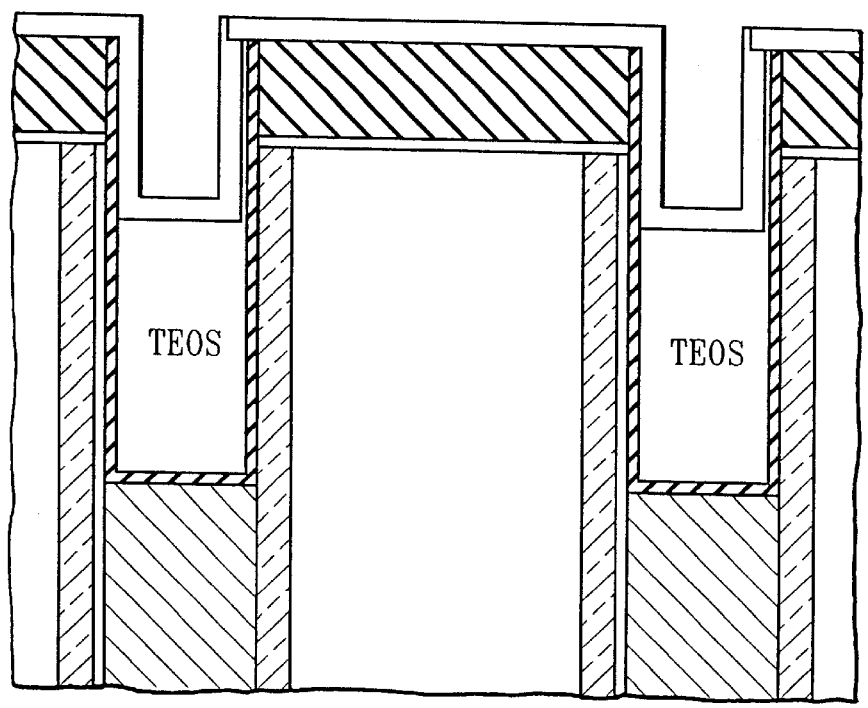
FIGS. 26–28 represent cross-sectional views of an embodiment of a structure according to the present invention at various stages according to a further embodiment of a process according to the present invention.
Figure 27:
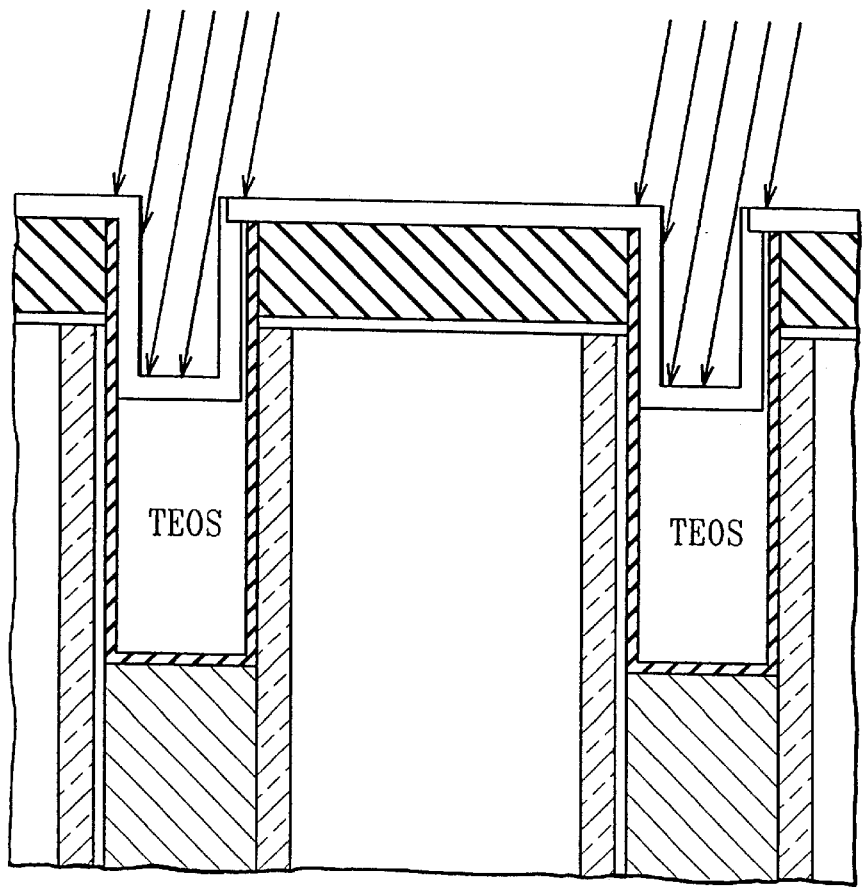
Figure 28A:
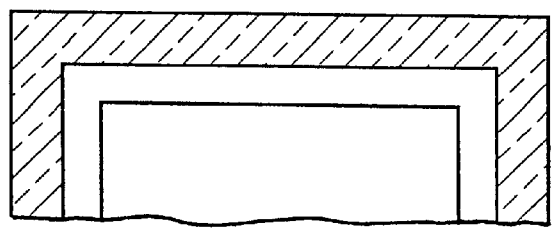
Figure 28:
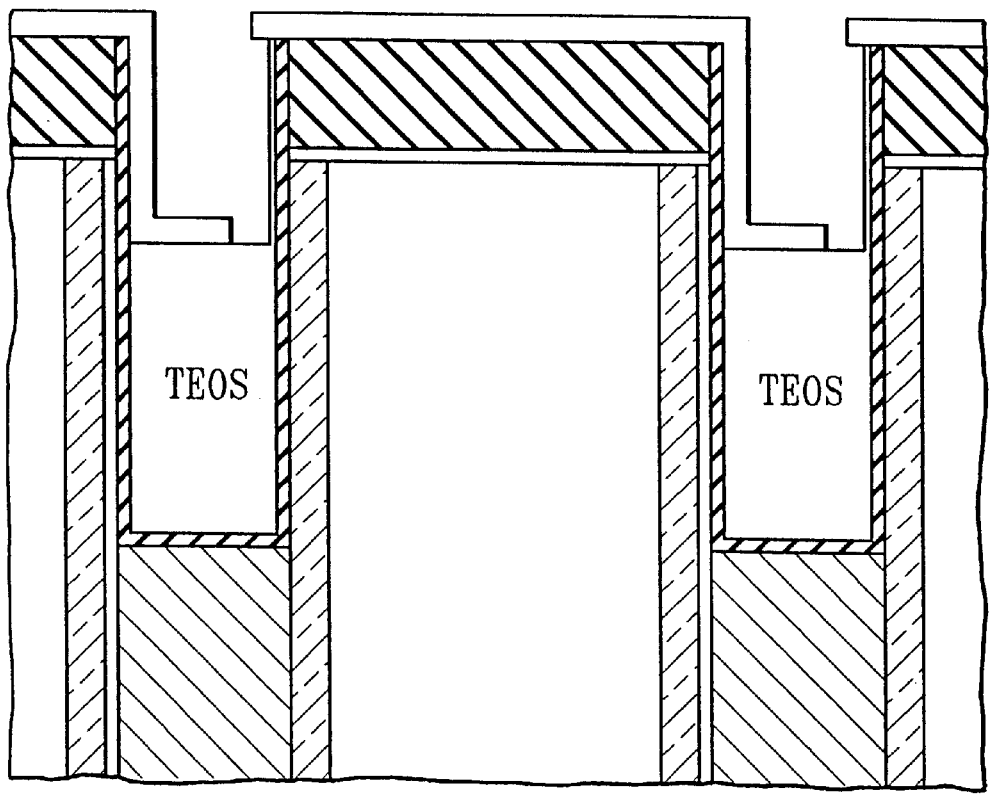

FIGS. 26–28 cross-sectional views of embodiment of a structure at various stages of another embodiment of a process according to the present invention. At the point in the process shown in FIG. 26, a further deep recess has been formed, which recesses polysilicon in the capacitor trench to a final level. The TEOS has been deposited in the deep trench.

The TEOS may be deposited on the thin blocking layer of nitride deposited as described above and as shown in FIG. 14. However, unlike the process step shown in FIG. 14, the thin layer of amorphous silicon is deposited over TEOS in the trench rather than over the nitride that the TEOS is deposited on. FIG. 26 illustrates the structure at this point.

Next, as represented in FIG. 27, the angled implant is carried out to implant ion species on only one side of the trench. Any ion species may be utilized, as desired.

According to one example, p+ type ions were utilized. One example of a p+ type ion is boron ion. The angled implant is described in greater detail with respect to FIGS. 14–25.

After carrying out the angled implant, the silicon left undoped by the angled implant may be etched selective to the doped silicon. This leaves a gap along only one side of the trench. According to this embodiment, after the angled implant is carried out, the TEOS may be etched. The etch may be carried out to the level of the nitride barrier layer over the trench polysilicon. FIG. 28 shows the structure at this point. FIG. 28a illustrates the structure from above.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A connecting structure from a node conductor of trench capacitor device in a semiconductor substrate, said connecting structure comprising:
   a) an isolation region located above said node conductor, at least a portion of said isolation region having an exterior surface which is substantially conformal with at least a portion of an adjacent wall of a trench of said trench capacitor,
   b) a buried strap region in said trench above said node conductor, said buried strap region being bounded laterally by said isolation region except at an opening in said isolation region, said buried strap region being in electrically conductive contact with said semiconductor substrate at said opening and with said node conductor in said trench, said buried strap region also being recessed in said trench to provide sufficient space above said buried strap region in said trench for a gate conductor of a transistor, and
   c) a buried strap outdiffusion region in said substrate at said opening, said buried strap outdiffusion region being in electrically conductive contact with said buried strap region.

2. The connecting structure of claim 1 further comprising a buried strap nitride between said buried strap region and said buried strap outdiffusion.

3. The connecting structure of claim 1 further comprising a trench top oxide in said trench over said buried strap region.

4. A connecting structure from a node conductor of trench capacitor device in a semiconductor substrate, said connecting structure comprising:
   a) an isolation region located above said node conductor, at least a portion of said isolation region having an exterior surface which is substantially conformal with at least a portion of an adjacent wall of a trench of said trench capacitor,
   b) a buried strap region in said trench above said node conductor, said buried strap region being bounded laterally by said isolation region except at an opening in said isolation region, said buried strap region being in electrically conductive contact with said semiconductor substrate at said opening and with said node conductor in said trench, and
   c) a buried strap outdiffusion region in said substrate at said opening, said buried strap outdiffusion region being in electrically conductive contact with said buried strap region.

5. A vertical transistor structure with connection to a node conductor of trench capacitor device in a semiconductor substrate, said structure comprising:
   a) an isolation region located above said node conductor, at least a portion of said isolation region having an exterior surface which is substantially conformal with at least a portion of an adjacent wall of a trench of said trench capacitor,
   b) a buried strap region in said trench above said node conductor, said buried strap region being bounded laterally by said isolation region except at an opening in said isolation region, said buried strap region being in electrically conductive contact with said semiconductor substrate at said opening and with said node conductor in said trench,
   c) a buried strap outdiffusion region in said substrate at said opening, said buried strap outdiffusion region being in electrically conductive contact with said buried strap region, said outdiffusion region being a drain region for said transistor,
   d) a trench top oxide in said trench over said buried strap region,
   e) a gate conductor of said transistor in said trench over at least a portion of said trench top oxide,
   f) a gate oxide of said transistor oriented vertically between said gate conductor and said semiconductor substrate, and
   g) a source region in contact with said gate oxide.

6. The transistor structure of claim 5 further comprising a buried strap nitride between said buried strap region and said buried strap outdiffusion.

* * * * *